(12) United States Patent
Dickinson

(10) Patent No.: US 6,424,028 B1
(45) Date of Patent: Jul. 23, 2002

(54) SEMICONDUCTOR DEVICES CONFIGURED TO TOLERATE CONNECTION MISALIGNMENT

(75) Inventor: Harvey F. Dickinson, Stockport (GB)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/671,889

(22) Filed: Sep. 28, 2000

(30) Foreign Application Priority Data

Sep. 28, 1999 (GB) .............................. 9922763

(51) Int. Cl.$^7$ .............................. H01L 23/02
(52) U.S. Cl. .............. 257/678; 257/690; 257/692; 257/693; 257/694; 257/723
(58) Field of Search ................. 257/678, 347, 257/68, 335, 328, 690, 692, 693, 694, 698, 724, 736, 773; 317/234, 235

(56) References Cited

U.S. PATENT DOCUMENTS

| | | | | |
|---|---|---|---|---|
| 3,457,639 A | * | 7/1969 | Weller | 29/626 |
| 3,497,947 A | * | 3/1970 | Ardezzone | 29/577 |
| 3,586,930 A | * | 6/1971 | Heath et al. | 317/235 |
| 4,010,488 A | * | 3/1977 | Gruszka et al. | 357/70 |
| 4,223,337 A | | 9/1980 | Kojima et al. | 357/68 |
| 5,324,971 A | | 6/1994 | Notley | 257/328 |
| 5,468,984 A | * | 11/1995 | Efland et al. | 257/356 |
| 5,506,539 A | | 4/1996 | Kelly et al. | 327/379 |
| 5,872,403 A | | 2/1999 | Bowman et al. | 257/780 |
| 5,874,764 A | * | 2/1999 | Hsieh | 257/401 |
| 5,892,283 A | | 4/1999 | Baldwin et al. | 257/758 |
| 5,900,643 A | | 5/1999 | Preslar et al. | 257/48 |
| 6,169,309 B1 | * | 1/2001 | Teggatz | 257/328 |

FOREIGN PATENT DOCUMENTS

| | | |
|---|---|---|
| GB | 1253708 | 11/1971 |
| JP | 04188643 | 7/1992 |
| JP | 404286353 A | * 10/1995 |
| WO | 9808250 A1 | 2/1998 |

* cited by examiner

*Primary Examiner*—Olik Chaudhuri
*Assistant Examiner*—Dana Farahani
(74) *Attorney, Agent, or Firm*—Steven R. Biren (57) ABSTRACT

A semiconductor device, e.g. power transistor (1, FIG. 1), has a gate or other electrode (4) connected via a test pad (15B) to a set of parallel fingers (21A–21F) in a first portion of a bond pad (12). An ESD protection device (13) is connected via a test pad (15C) to a set of parallel fingers (22A–22C) in a second portion of the bond pad (12). A voltage clamping protection device (14) is connected via a test pad (15A) to a set of parallel fingers (23A–23C) in a third portion of the bond pad (12). The three sets of fingers overlap in an interdigitated pattern defining a bond pad area (24). The transistor (1) and the protection devices (13, 14) may be independently tested and then connected to a same terminal (7C) by a wire (16) bonded over a rectangular bonded region (25) extending across the bond pad area (24). This arrangement allows for a large misalignment in the bond process while still achieving connection of the three bond pad portions.

19 Claims, 6 Drawing Sheets

SEMICONDUCTOR DEVICES CONFIGURED TO TOLERATE CONNECTION MISALIGNMENT

BACKGROUND OF THE INVENTION

This invention relates to semiconductor devices having more than one electrical circuit component formed in a semiconductor device body. Such a semiconductor device may be, for example, an integrated circuit, having analogue and/or digital circuits. Otherwise such a semiconductor device may be, for example, a semiconductor power device with one or more protection devices.

Semiconductor devices as just described usually have more than one circuit component in the device body connected to a same electrical terminal, and it may be desired to provide for independent testing of these components before connecting them to this terminal. It is also desirable to minimise the number of terminal connections, for example bonded wires or straps, from the semiconductor device body.

It is known to achieve both of the two just described objectives by providing a semiconductor device as disclosed in U.S. Pat. No. 4,223,337, WO-A-98/08250, U.S. Pat. No. 5,900,643 and U.S. Pat. No. 5,892,283, the whole contents of which are hereby incorporated herein as reference material. These known prior art arrangements include:

a semiconductor device body having first and second electrical circuit components formed therein;

an electrical conductor layer formed on said semiconductor device body, said conductor layer including a first bond pad portion electrically connected by said layer to said first circuit component and said conductor layer including a second bond pad portion electrically connected by said layer to said second circuit component, said first and second bond pad portions being formed separated and electrically isolated from each other, thereby permitting independent electrical testing of said first and second circuit components prior to electrical connection of the first and second bond pad portions to a same electrical terminal; and terminal connection means bonded at one end thereof to the said first and second bond pad portions to electrically connect those portions on said device body, said terminal connection means being connected at another end thereof to said electrical terminal.

SUMMARY OF THE INVENTION

An aim of the present invention is to provide a semiconductor device in which, inter alia, disadvantages of these prior art arrangements are overcome or reduced.

According to the present invention there is provided a semiconductor device including first and second bond pad portions electrically connected to respective first and second circuit components by a conductor layer, wherein the first and second bond pad portions are separate from each other, thereby permitting independent electrical testing of the first and second circuit components prior to electrical connection of the first and second bond pad portions to a same electrical terminal; and wherein the device is characterised in that the first and second bond pad portions each has a respective set of parallel fingers disposed in an interdigitated pattern, which defines a bond pad area; and in that the terminal connection means comprises an elongate portion bonded to said device body over a substantially rectangular bonded region with the length of said bonded region extending in a direction across the fingers of said interdigitated bond pad area.

The combination of these characterising features of the present invention, allows for a large misalignment in the bonding process, as performed by auto-bonding machines, while nevertheless achieving connection of the first and second bond pad portions and hence connection, after testing, of the first and second electrical components to the same electrical terminal. Thus, misalignment of the bonded region along nearly the whole length of the fingers of the two sets of parallel fingers, that is to say across the width of the bond pad area will still connect the two sets of fingers. Also, even if there are only two fingers in each set this will provide three gaps along the length of the bond pad area such that if any one of these gaps is bridged by the bonded region then the first and second bond pad portions will be connected. If the bonded region is misaligned in both directions towards a corner of the bond pad area, and possibly also skewed, there is still a high probability that at least one finger from each of the two sets will be covered and the first and second bond pad portions will be connected.

The first circuit component of the semiconductor device of the invention may be a semiconductor power device having first and second main electrodes and a control electrode, the first bond pad portion being connected by the conductor layer to one of these electrodes of the power device. This power device may be a power transistor device, the first electrode being a drain electrode, the second electrode being a source electrode, and the control electrode being a gate electrode. Suitably in this case the second circuit component is a protection device connected between the gate electrode and one of the drain and source electrodes for protecting the power transistor device. A preferred arrangement with a protection device connected in this way is where the first bond pad portion is connected by the conductor layer to the gate electrode of the power transistor. In this preferred arrangement the protection device may be an electrostatic discharge (ESD) diode protection device, or it may be a voltage clamping diode protection device.

Prior art document U.S. Pat. No. 4,223,337 mentions an electrode pad being divided into plural parts without being any more specific, and prior art document WO-A-98/08250 mentions that more than two bonding pads may be involved, for example in a radial orientation which would be problematic. By contrast, the combination of characterising features of the present invention as defined in the preceding main statement of the invention very readily lends itself to having more than two bond pad portions for independent testing of corresponding more than two electrical components which are then connected to a same terminal.

Thus in a semiconductor device in accordance with the invention, the semiconductor device body may have a third electrical circuit component formed therein, and a respective third bond pad portion may be electrically connected by the conductor layer to the third circuit component, the third bond pad portion being separate from the first and second bond pad portions, thereby permitting independent electrical testing of the third circuit component prior to electrical connection of the first, second and third bond pad portions to said electrical terminal. The terminal connection means may be bonded at the one end thereof to the first, second and third bond pad portions to electrically connect those three portions on the said device body. Thus, the third bond pad portion may have a respective third set of parallel fingers disposed to overlap at least one the first and second sets of fingers such that the bond pad area is defined by the interdigitated pattern formed by the first, second and third sets of fingers; and with the length of the substantially rectangular bonded region extending in a direction across the first, second and third sets of fingers of the interdigitated bond pad area.

A suitable implementation for the arrangement just defined is where the first circuit component is a power transistor device having a drain electrode, a source electrode and a gate electrode, where the first bond pad portion is connected by the conductor layer to the gate electrode, where the second circuit component is an electrostatic discharge (ESD) diode protection device connected by the conductor layer between the second bond pad portion and one of the drain and source electrodes, and where the third circuit component is a voltage clamping diode protection device connected by the conductor layer between the third bond pad portion and the other of the drain and source electrodes.

In a semiconductor device according to the present invention, at least one set of parallel fingers preferably has at least three parallel fingers in that set. In this case, at least one set of parallel fingers may have all the fingers of the set connected by the conductor layer outside the bond pad area at one end of the fingers of that set. Alternatively, or in addition, at least one set of parallel fingers may have successive pairs of the fingers of that set connected by the conductor layer outside the bond pad area at opposite ends of the fingers of that set to form a serpentine conductor layer path with the fingers of that set. For example, in the case of three bond pad portions connected respectively to the gate electrode of a power transistor, an ESD protection device and a voltage clamping device the arrangement may have the fingers for the ESD protection device connected at their one end, the fingers for the voltage clamping device connected at their other end, and the fingers for the gate electrode connected in a serpentine path and interdigitated with both the other two sets of fingers.

In a semiconductor device according to the present invention, the terminal connection means may be a metal wire which is wedge-bonded at the one end thereof to the bond pad portions. The length of the bonded region may be at least three times the diameter of the metal wire. This facilitates connection of more than two bond pad portions, and also helps to ensure connection of the bond pad portions taking into account misaligned placement of the bonded region. Alternatively the terminal connection means may be a metal strap which is bonded at the one end thereof to the bond pad portions.

In a semiconductor device according to the present invention, the conductor layer may provide a test pad for each circuit component outside the bond pad area for the independent electrical testing of that circuit component.

BRIEF DESCRIPTION OF THE DRAWING

Embodiments of the present invention will now be described, by way of example, with reference to the accompanying drawings, in which.

DESCRIPTION OF THE PREFERRED EMBODIMENTS

Figure 1:
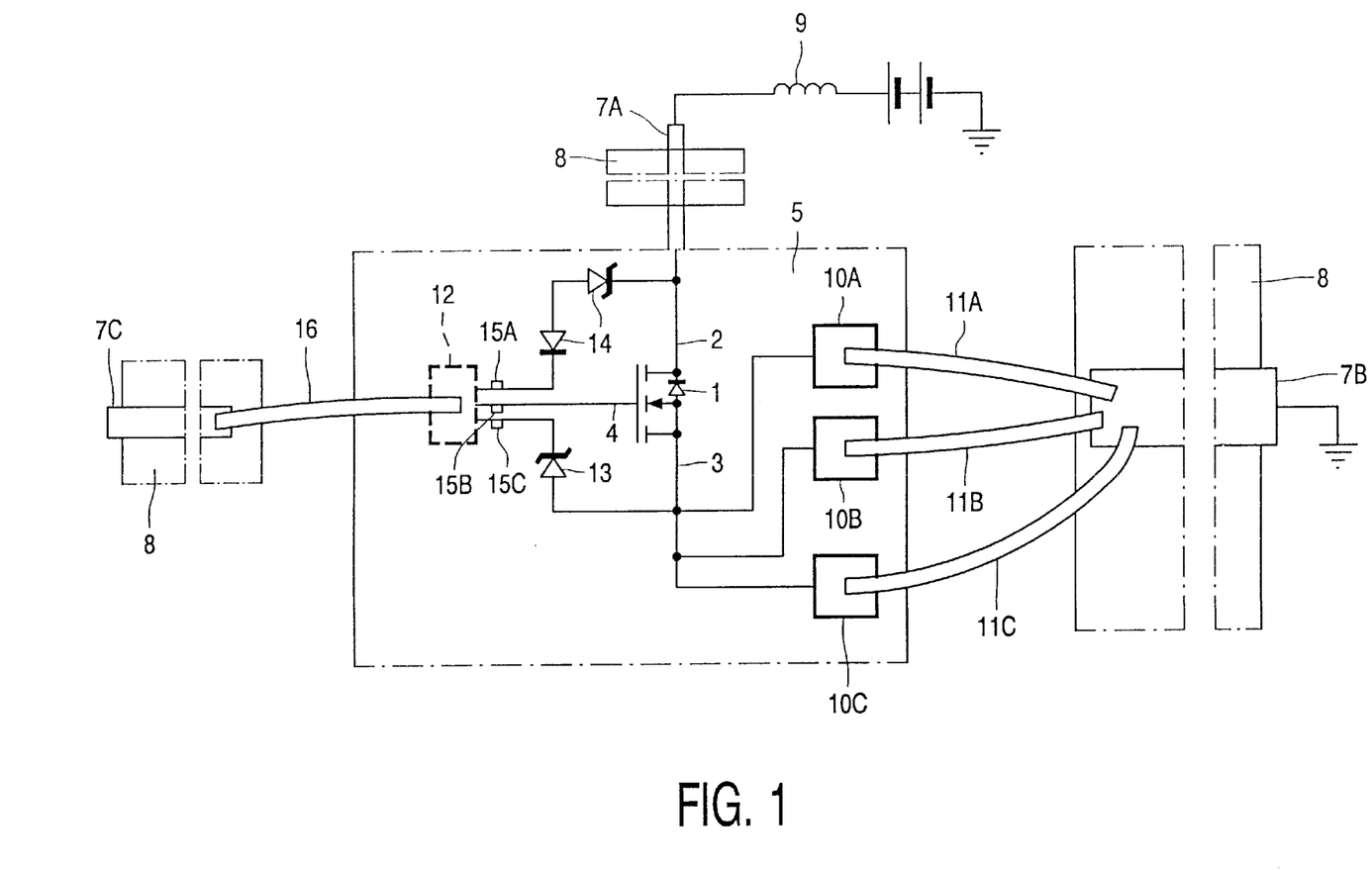
FIG. 1 shows diagrammatically, in part structural form plan view and part circuit form, a semiconductor device according to one embodiment of the invention, the device including a semiconductor power transistor and two diode protection devices formed in a semiconductor device body and connected to terminals in a device package, together with an inductive load connected to the device.

Referring now to FIG. 1, a MOSFET power transistor 1 having a drain electrode 2, a source electrode 3 and a gate electrode 4 is formed in a semiconductor device body 5. The transistor 1 has a vertical structure with the drain electrode 2 at the bottom connected to a lead frame electrical terminal 7A of a device package 8, and the transistor 1 controls current through a solenoid 9 connected to the terminal 7A. An electrical conductor layer formed on the device body 5 includes three bond pads 10A, 10B and 10C connected to the source electrode 3. Three metal wires 11A, 11B and 11C are each wedge bonded at one end to a respective one of the bond pads 10A, 10B and 10C and are wedge bonded at their other ends to the same electrical terminal 7B of the package 8. The three bond pads 10A–10C and parallel connected wires 11A–11C provide low resistance for the relatively large current controlled by the power transistor 1.

The conductor layer on the device body 5 also forms a bond pad 12 having three bond pad portions formed separated and electrically isolated from each other. The conductor layer pattern within the bond pad 12 is shown in detail in FIG. 2 and will be described later with reference to that Figure. A first one of the three bond pad 12 portions is connected by the conductor layer to the gate electrode 4. An electrostatic discharge (ESD) diode protection device 13 formed in the device body 5 as a Zener diode is connected by the conductor layer between a second one of the three bond pad 12 portions and the source electrode 3. A voltage clamping diode protection device 14 formed in the device body 5 as a series connected Zener diode and blocking diode is connected by the conductor layer between a third one of the three bond pad 12 portions and the drain electrode 2. The three separated bond pad 12 portions permit independent electrical testing of the transistor 1 and the protection devices 13 and 14 prior to electrical connection of these three bond pad portions to a same electrical terminal. The conductor layer provides three corresponding test pads 15A, 15B and 15C outside the bond pad 12 for this independent electrical testing. The electrical connection from the bond pad 12 is by way of a metal wire 16 wedge bonded at one end to the three bond pad portions of bond pad 12 and wedge bonded at the other end to an electrical terminal 7C of the package 8.

Although, for simplicity, the ESD diode protection device 13 is shown in FIG. 1 as a single Zener diode, typically two or three diodes in series may be present respectively providing 14 volts or 21 volts ESD protection. Similarly, the voltage clamping diode protection device 14 will typically have more than the two diodes shown and may typically have a breakdown voltage of 40 volts compared with a drain to source breakdown voltage of the transistor 1 which may be 100 volts. Prior to wedge bonding the wire 16, the ESD protection voltage may be independently tested via the test pad 15C, the breakdown voltage of the clamping diodes 14 may be independently tested via the test pad 15A, the gate oxide of the transistor 1 may be sufficiently stressed and independently tested via the test pad 15B without restraint by the ESD protection device 13, and the drain to source breakdown voltage of the transistor 1 may be tested without restraint by the voltage clamping protection device 14.

The semiconductor device body 5 on which the conductor layer referred to above is formed will have a top insulating layer immediately under this conductor layer and will have a semiconductor substrate and a semiconductor layer or layers thereon with active device regions for the power transistor 1. The diode protection devices 13 and 14 may be formed within the same part of the semiconductor device body as the transistor 1. In an alternative arrangement, for example as disclosed in U.S. Pat. No. 5,324,971 (our reference PHB33789), the semiconductor device body 5 may include a further insulating layer on top of the just mentioned semiconductor substrate and semiconductor layer(s), and an intermediate semiconductor layer between this further insulating layer and the top insulating layer with the diode protection devices 13 and 14 being formed in the intermediate semiconductor layer.

Figure 2:
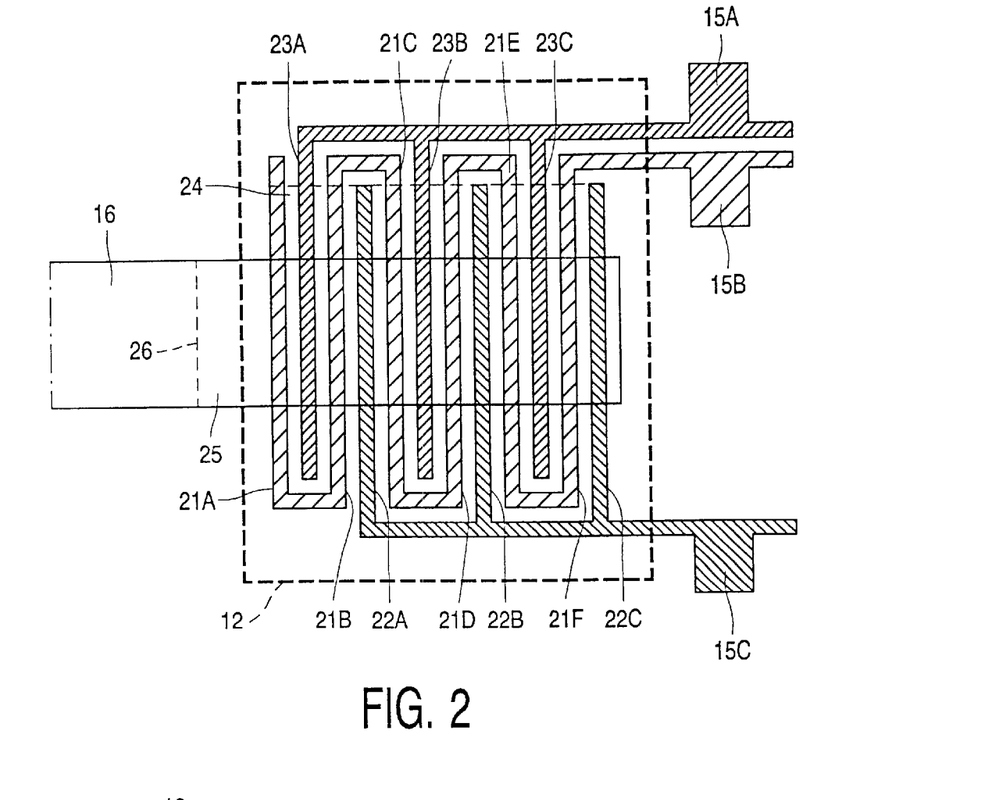
FIG. 2 shows, in enlarged plan view, the detail of the conductor layer pattern of the bond pad area of FIG. 1 having separate bond pad portions respectively connected to the gate electrode of the power transistor and to the two diode protection devices, and a metal wire wedge bonded over a rectangular bonded region to connect the three bond pad portions.

Referring now to FIG. 2, there is shown the detail of the conductor layer pattern of the bond pad 12 of FIG. 1. The test pad 15B for the transistor gate electrode is connected by the conductor layer to a first bond pad portion having a first set of six parallel fingers 21A, 21B, 21C, 21D, 21E and 21F. The test pad 15C for the ESD diode protection device is connected by the conductor layer to a second bond pad portion having a second set of three parallel fingers 22A, 22B and 22C. The test pad 15A for the voltage clamping diode protection device is connected to a third bond pad portion having a third set of three parallel fingers 23A, 23B and 23C. The three sets of parallel fingers 21A–21F, 22A–22C, and 23A–23C are disposed adjacent to each other in an interdigitated pattern with no direct contact therebetween, the interdigitated pattern defining a bond pad area 24. As shown in FIG. 2 the bond pad area 24 is bounded by the left hand edge of finger 21A, by the right hand edge of finger 22C, by a horizontal dashed line across the upper ends of fingers 22A–22C and by a horizontal dashed line across the lower ends of fingers 23A–23C. As can be seen in FIG. 2, each of the two sets of parallel fingers 22A–22C and 23A–23C has the three fingers of the set connected by the conductor layer outside the bond pad area 24 at one end of the fingers of the set, and the set of parallel fingers 21A–21F has successive pairs of the fingers of the set connected by the conductor layer outside the bond pad area 24 at opposite ends of the fingers of the set to form a serpentine conductor layer path with the fingers of the set. The metal wire 16 includes an elongate portion at one end bonded to the semiconductor device body over a substantially rectangular bonded region 25, extending to the vertically dashed line 26 shown in FIG. 2, with the length of the bonded region 25 extending in a direction across the interdigitated fingers of the bond pad area 24. Metal wire 16 thus shunts across fingers 21A–21F, 22A–22C and 23A–23C to cause an equal electrical potential therebetween.

Figure 3:
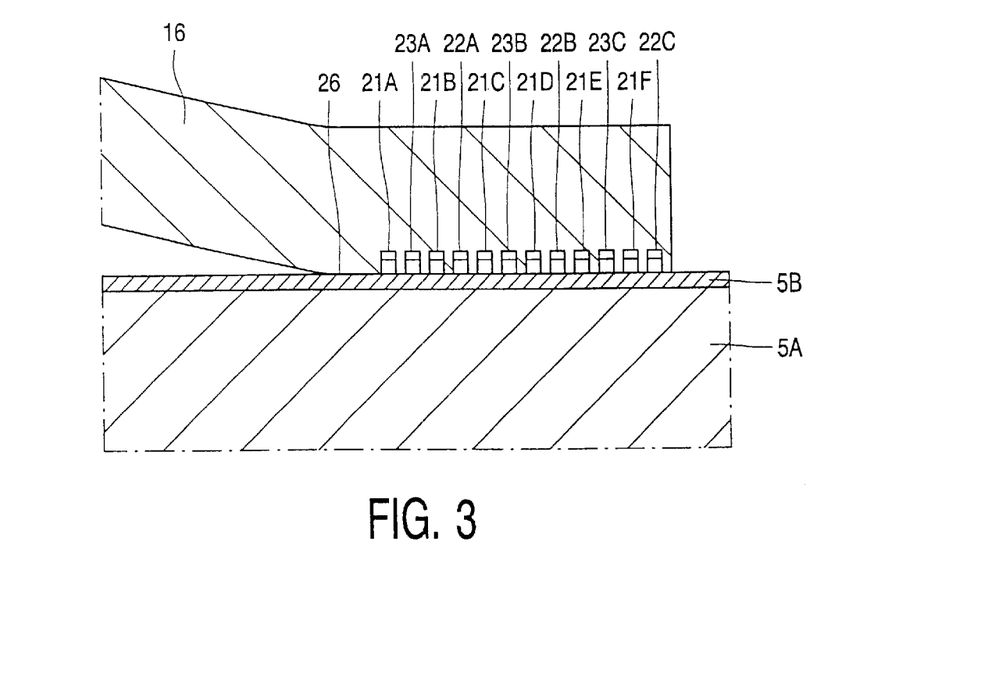
FIG. 3 shows a diagrammatic section side view through the length of the wire of FIG. 2 and showing the conductor layer fingers on the semiconductor device body.

Referring now to FIG. 3, there is shown a diagrammatic section view through the length of the wire 16 of FIG. 2. The semiconductor device body 5 of FIG. 1 is shown in FIG. 3 as having a semiconductor substrate and semiconductor layer(s) 5A with a top insulating layer 5B.

Referring to FIGS. 2 and 3, the conductor layer formed on the semiconductor device body 5A, 5B is typically aluminium. The thickness of each of the bond pad fingers of the sets 21A–21F, 22A–22B and 23A–23B may be 10 μm, and in this case the width of these fingers and the width of the gaps between these fingers may also be 10 μm. The diameter of the wire 16 may be 125 μm and when wedge bonded the width of the bonded region 25 may also be approximately 125 μm. For simplicity, the extended width of the wedge bonded portion of the wire 16 is not shown in FIG. 2. The overlapping length of the bond pad fingers forming the width of the bond pad area 24 may in this case be 250 μm. The length of the bonded region 25 is a usual wedge bonded length of at least three times the diameter of the metal wire 16. The areas of each of the three test pads 15A–15C may typically be 50 μm square.

Reference has been made above to wedge bonding the metal wire 16, and also the metal wires 11A–11C shown in FIG. 1. This wedge bonding may be achieved by known thermo-compression or ultrasonic compression techniques. Other known bonding techniques for these wires, for example using conductive adhesive or solder, may be employed. The metal wire 16 provides terminal connection means bonded at one end thereof to the portions of the bond pad 12 and connected at another end thereof to the electrical terminal 7C. Such a terminal connection means may alternatively be provided by a metal strap. Such metal straps, which are typically copper, are a known low electrical resistance alternative to metal wires. One example is disclosed in GB-A-1,253,708 where the straps are lead portions of a lead strip which are soldered to bond pads on a plurality of semiconductor dice in a package. A more recent example is disclosed in U.S. Pat. No. 5,872,403 where a power semiconductor transistor die is mounted on a circuit substrate and a metal strap is soldered at each end to connect a source electrode of the transistor to the substrate, prior to encapsulation.

Referring back to FIG. 1, the MOSFET power transistor 1 has both an ESD diode protection device 13 and a voltage clamping diode protection device 14 formed in the device body 5. Not all such power transistors have both these diode protection devices. Depending, for example, on the structural configuration of the transistor or the level of currents controlled by the transistor, then the transistor 1 may have only the protection device 13 or only the protection device 14. Thus there could be only two electrical circuit components formed in the semiconductor device body 5 which are connected to a bond pad 12 having two bond pad portions, the first circuit component being the power transistor 1 and the second circuit component being either the diode protection device 13 or the diode protection device 14. In this case, the two bond pad portions may be any two of the three bond pad portions shown in FIG. 2, that is the set of fingers 21A–21F interdigitated with one of the two sets of fingers 22A–22C and 23A–23C, or alternatively the set of fingers 22A–22C interdigitated with the set of fingers 23A–23C.

Figure 4:
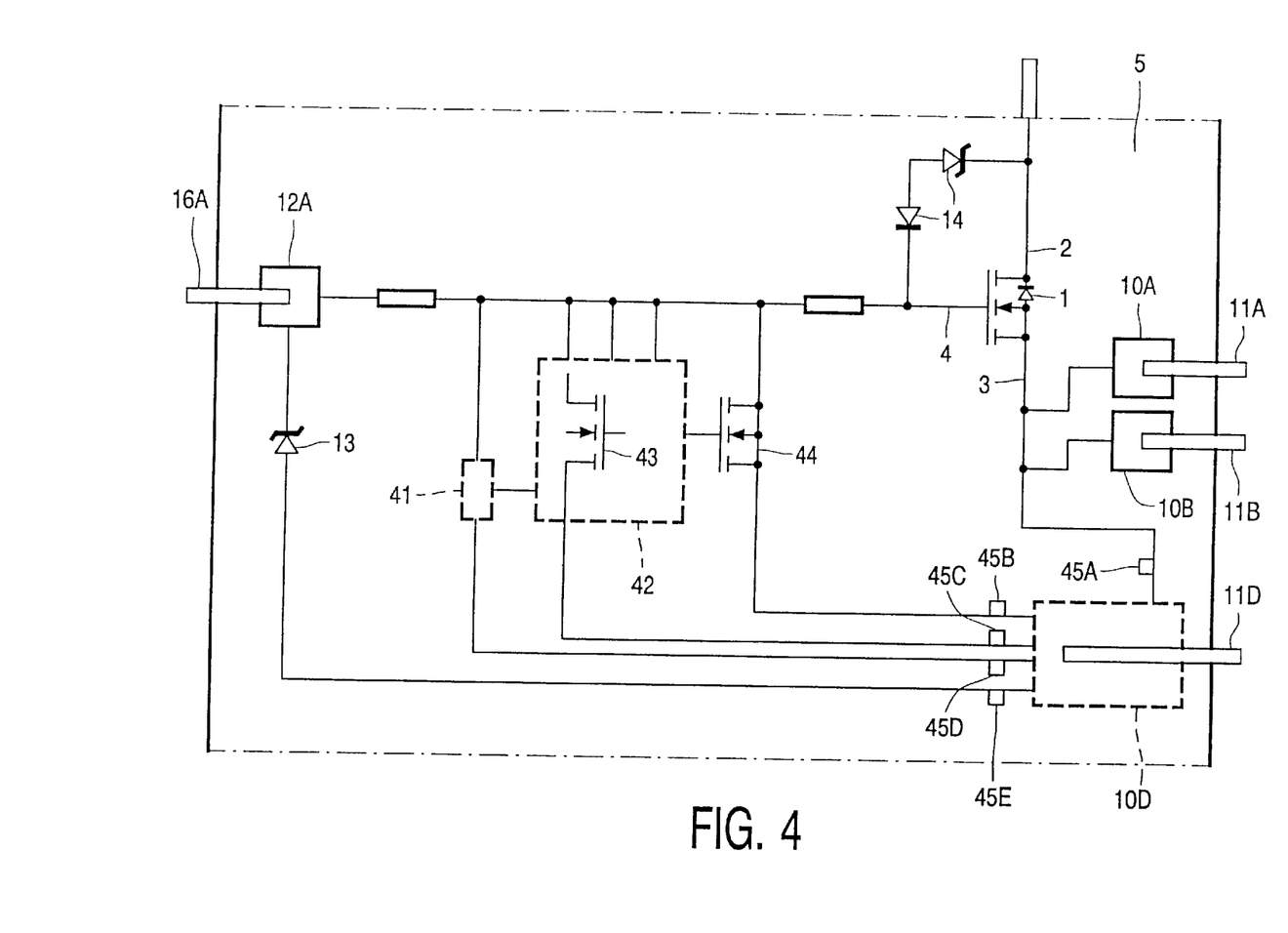
FIG. 4 shows a similar view to that of FIG. 1 of a semiconductor device according to another embodiment of the invention, without the device package terminals and inductive load, having a fault detection circuit, a gate control circuit and a further transistor connected between the gate and source electrodes of the power transistor.

Referring now to FIG. 4, another semiconductor device is shown which is a modification of the device shown in FIG. 1 and which does not show the device package terminals and inductive load. The MOSFET power transistor 1 formed in the semiconductor device body 5 with an ESD diode protection device 13 and a voltage clamping diode protection device 14 are the same as for the device shown in FIG. 1. However, FIG. 4 shows a fault detection circuit 41, a gate control circuit 42 including a transistor 43, and a pull down transistor 44 additionally connected between the gate electrode 4 and the source electrode 3 of the power transistor 1. A one part bond pad 12A is shown connected to the gate electrode 4 with a metal wire 16A wedge bonded at one end to the bond pad 12A. The bond pads 10A and 10B connected to the source electrode 3 and having metal wires 11A and 11B wedge bonded thereto at one end are the same as for the device shown in FIG. 1. Instead of the source bond pad 10C shown in FIG. 1, the conductor layer in the device body 5 of FIG. 4 forms a bond pad 10D having five bond pad portions formed separated and electrically isolated from each other. The conductor layer pattern within the bond pad 10D is shown in detail in FIG. 5 and will be described later with reference to that Figure. A first one of the five bond pad 10D portions is connected via a test pad 45A to the source electrode 3. A second one of the bond pad 10D portions is connected via a test pad 45B to the transistor 44. A third one of the bond pad 10D portions is connected via a test pad 45C to the transistor 43 in the circuit 42. A fourth one of the bond pad 10D portions is connected via a test pad 45D to the circuit 41. A fifth one of the bond pad 10D portions is connected via a test pad 45E to the ESD diode protection device 13. The five separated bond pad 10D portions permit independent electrical testing of the power transistor 1, the transistor 44, the circuit 42 via the transistor 43, the circuit 41 and the ESD protection device 13 prior to electrical connection of these five bond pad portions to a same electrical terminal by way of the metal wire 11D. Details of the configuration and operation of the circuit components 41, 42, 43 and 44 are disclosed in U.S. Pat. No. 5,506,539 (our reference PHB 33904), in particular with reference to FIG. 4 of that document in which these circuit components are shown all directly connected to the source electrode of the power transistor.

Figure 5:
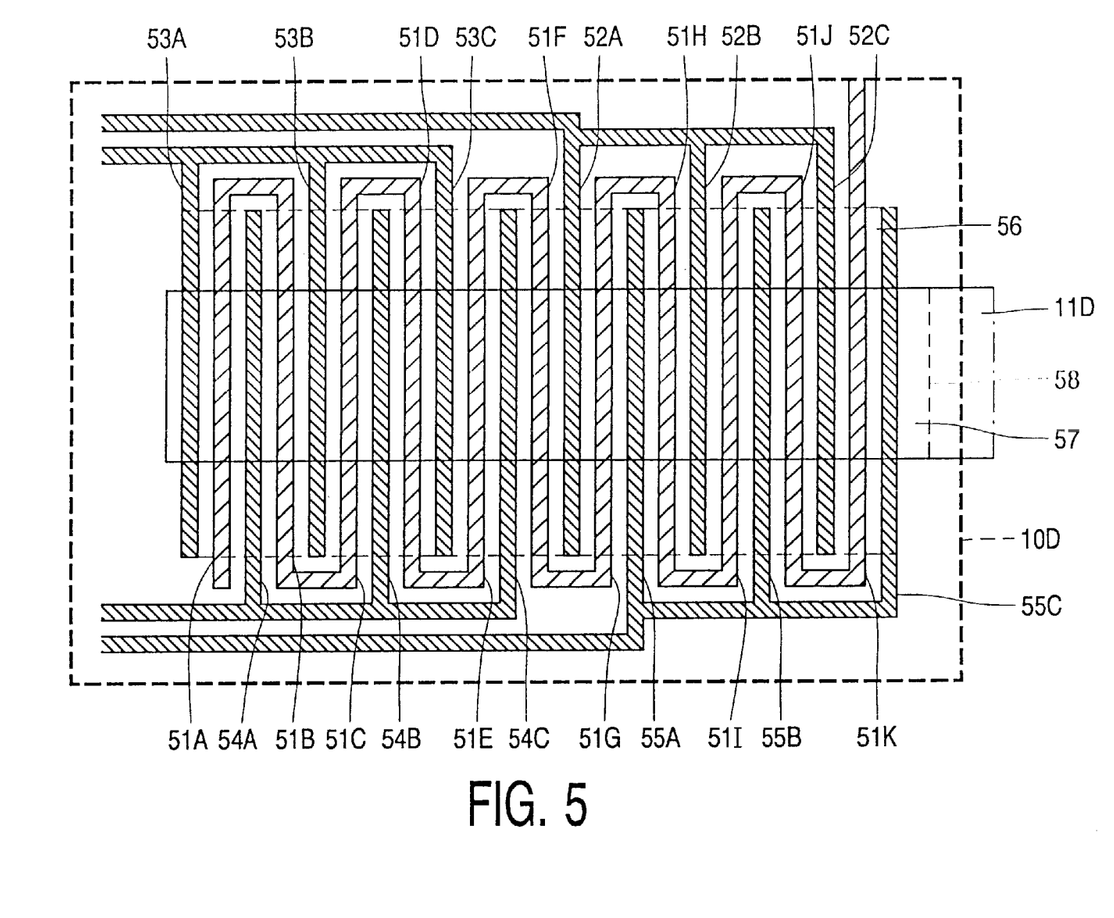
FIG. 5 shows a similar view to that of FIG. 2 of the bond pad area of FIG. 4 having separate bond pad portions respectively connected to the source electrode of the power transistor, to one of the diode protection devices, to the fault detection circuit, to the gate control circuit and to the further transistor, with a metal wire bonded region connecting the five bond pad portions.

Referring now to FIG. 5, there is shown the detail of the conductor layer pattern of the bond pad 10D of FIG. 4. The test pad 45A (shown in FIG. 4) for the power transistor source electrode is connected by the conductor layer to a first bond pad portion having a first set of eleven parallel fingers 51A–51K. The test pad 45B (shown in FIG. 4) for the pull-down transistor 44 is connected by the conductor layer to a second bond pad portion having a second set of three parallel fingers 52A–52C. The test pad 45C (shown in FIG. 4) for the transistor 43 of the gate control circuit is connected by the conductor layer to a third bond pad portion having a third set of three parallel fingers 53A–53C. The test pad 45D (shown in FIG. 4) for the fault detection circuit 41 is connected by the conductor layer to a fourth bond pad portion having a fourth set of three parallel fingers 54A–54C. The test pad 45E (shown in FIG. 4) for the ESD protection device 13 is connected by the conductor layer to a fifth bond pad portion having a fifth set of three parallel fingers 55A–55C. The two sets of fingers 52A–52C and 53A–53C are disposed to overlap each other, the two sets of fingers 54A–54C and 55A–55C are disposed to overlap each other, and these four sets of fingers are overlapped by the set of fingers 51A–51K in an interdigitated pattern defining a bond pad area 56. As shown in FIG. 5 the bond pad area 56 is bounded by the left hand edge of finger 53A, by the right hand edge of finger 55C, by a horizontal dashed line across the upper ends of fingers 54A–54C and 55A–55C and by a horizontal dashed line across the lower ends of the fingers 53A–53C and 52A–52C. Each of the four sets of fingers 54A–54C, 55A–55C, 53A–53C and 52A–52C has the three fingers of the set connected by the conductor layer outside the bond pad area 56 at one end of the fingers of the set, and the set of fingers 51A–51K has successive pairs of the fingers of the set connected by the conductor layer outside the bond pad area 56 at opposite ends of the fingers of the set to form a serpentine conductor layer path with the fingers of the set. The metal wire 11D includes an elongate portion at one end bonded to the semiconductor device body over a substantially rectangular bonded region 57, extending to the vertically dashed line 58 shown in FIG. 5, with the length of the bonded region 57 extending in a direction across the fingers of the interdigitated bond pad area 56. The dimensions of the fingers and gaps may be the same as has been described in relation to FIGS. 2 and 3. The length of the bonded region 57 shown in FIG. 5 is approximately four times the diameter of the metal wire 11D, which is within usual wedge bonding practice for bonding using a single wedge. Wedge bonding practice includes the possibility of using two wedges end-to-end, so that an interdigitated bond pad area as shown in FIG. 5 could be extended to include more than five bond pad portions for independent testing of respectively connected electrical components prior to connection of the bond pad portions by a wedge bonded wire.

The semiconductor devices described above and as shown in FIGS. 1 and 4 include a MOSFET power transistor 1 having a vertical structure with the drain electrode at the bottom. Alternatively the MOSFET power transistor could have a vertical structure with the source electrode at the bottom. In this latter case, the three part bond pad 12 and the connections thereto as shown in FIG. 1 could be the same, and the drain electrode would instead be connected to bond pads similar to the bond pads 10A–10C shown in FIG. 1. One of the drain bond pads could then be a two part bond pad for independent testing of the voltage clamping diode protection device 14 and the power transistor 1 prior to connection of these two electrical components to a same electrical terminal of the device package. The MOSFET power transistor 1 may have a lateral structure rather than a vertical structure, in which case two or more part bond pads having one part connected to any of the drain, source and gate electrodes are possible. Instead of a MOSFET power transistor, the semiconductor device may include, as a first electrical component connected to one interdigitated bond pad portion of a two or more part bond pad, another type of semiconductor power device having first and second main electrodes and a control electrode. Such another type of semiconductor power device may be an insulated gate bipolar transistor (IGBT) or a Darlington bipolar transistor.

Figure 6A:
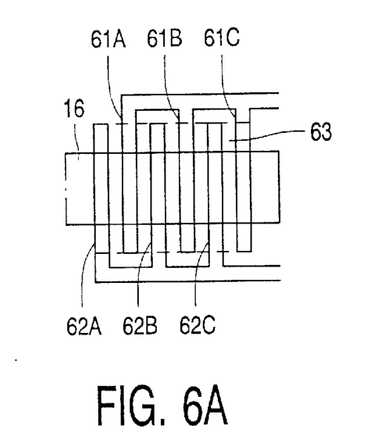
FIGS. 6A and 6B show views of further bond pad area patterns in accordance with the invention, respectively similar to FIGS. 2 and 5 but modified to show two and four bond pad portions.

Referring now to FIG. 6A, there is shown a two part bond pad pattern which can be compared with the pattern shown in FIG. 2. A first bond pad portion has a first set of three parallel fingers 61A–61C, and a second bond pad portion has a second set of three parallel fingers 62A–62C. The two sets of fingers are disposed to overlap each other in an interdigitated pattern bond pad area 63, the fingers of each set being connected by the conductor layer outside the bond pad area 63 at one end of the fingers of the set. The first and second bond pad portions could be connected respectively to the FIG. 1 voltage clamping diode protection device 14 and to the FIG. 1 power transistor gate electrode 4. This would be in the case where there is no ESD diode protection means, which possibility has been discussed above. A metal wire 16, as shown in FIGS. 1 and 2 and described in relation to those Figures, is shown in FIG. 6A connecting the two bond pad portions.

Figure 6B:
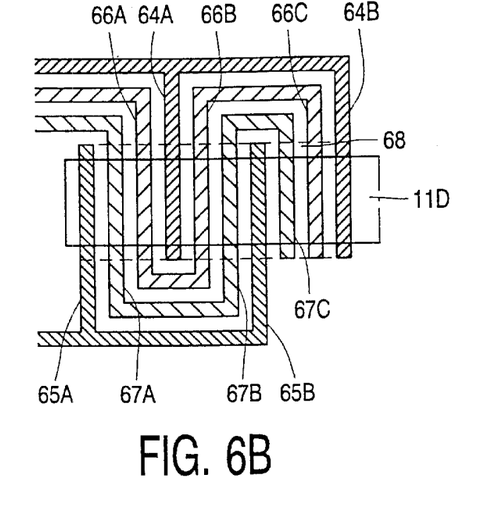

Referring now to FIG. 6B, there is shown a four part bond pad pattern which can be compared with the pattern shown in FIG. 5. A first bond pad portion has a first set of two parallel fingers 64A, 64B, a second bond pad portion has a second set of two parallel fingers 65A, 65B, a third bond pad to portion has a third set of three parallel fingers 66A–66C, and a fourth bond pad portion has a fourth set of three parallel fingers 67A–67C. The four sets of fingers are disposed to overlap each other in an interdigitated bond pad area 68. The fingers of the first set 64A, 64B and the fingers of the second set 65, 65B are in each case connected by the conductor layer outside the bond pad area 68 at one end of the fingers of the set. For each of the sets 66A–66C and 67A–67C, successive pairs of the fingers of the set are connected by the conductor layer outside the bond pad area 68 at opposite ends of the fingers of that set to form a serpentine conductor layer path with the fingers of that set. The pattern shown in FIG. 6B demonstrates the possibility of having two finger sets following the same serpentine path together, in this case between other sets of same end connected fingers. The four bond pad portions could be connected respectively to the FIG. 4 power transistor source electrode 3, the ESD diode protection means 13 and two other electrical circuit components, for example the transistors 43 and 44 as shown in FIG. 4. A metal wire 11D, as shown in FIGS. 4 and 5 and described in relation to those Figures, is shown in FIG. 6B connecting the four bond pad portions.

Bonding of terminal connection means, such as the wire 16 shown in FIGS. 1 to 3 and the wire 11D shown in FIGS. 4 and 5, to bond pads on semiconductor device bodies is now mainly performed by auto-alignment auto-bonding machines which will inherently involve some imprecision in placement of the bond. The combination of the characterising features of the present invention, that is involving interdigitated bond pad portions and a rectangular bonded region with its length extending across the fingers of the bond pad portions, allows for a large misalignment in the bonding process, as performed by auto-bonding machines, while nevertheless achieving connection of the bond pad portions and hence connection, after testing, of the electrical components connected by those bond pad portions to the same electrical terminal. This is demonstrated in FIGS. 7A–7C and FIGS. 8A and 8B.

Figure 7A:
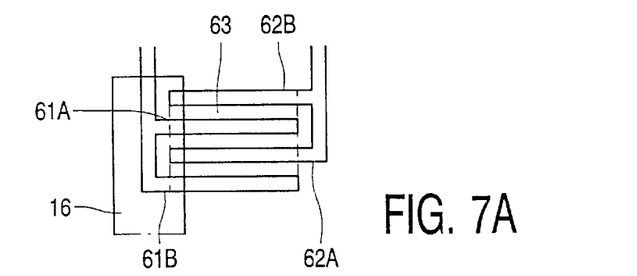
FIGS. 7A, 7B and 7C show the view of FIG. 6A with various misalignments of the bonded region of the wire which nevertheless in each case connects the two bond pad portions.
Figure 7B:
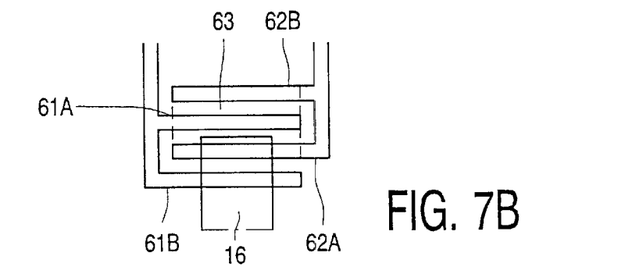
Figure 7C:
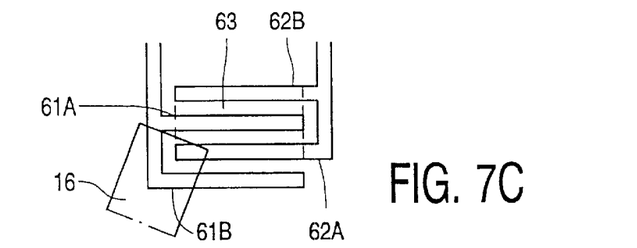

Referring now to FIGS. 7A to 7C, the two part bond pad pattern of FIG. 6A is shown again but with only two fingers in each set 61A, 61B and 62A, 62B. FIG. 7A shows that misalignment of the bonded region of the wire 16 along nearly the whole length of the fingers, that is to say across the width of the bond pad area 63 will still connect the two sets of fingers. Generally, the more fingers there are in each bond pad portion of an interdigitated bond pad the better it is and at least three fingers in each bond pad portion is preferred. However, FIG. 7B shows that for two bond pad portions, even if there are only two fingers in each set this will provide three gaps along the length of the bond pad area 63 such that if any one of these gaps is bridged by the bonded region of the wire 16 then the two bond pad portions will be connected. FIG. 7C shows that if the bonded region of the wire 16 is misaligned in both directions towards a corner of the bond pad area 63, and also skewed, there is still a high probability that at least one finger from each of the two sets will be covered and the first and second bond pad portions will be connected.

Figure 8A:
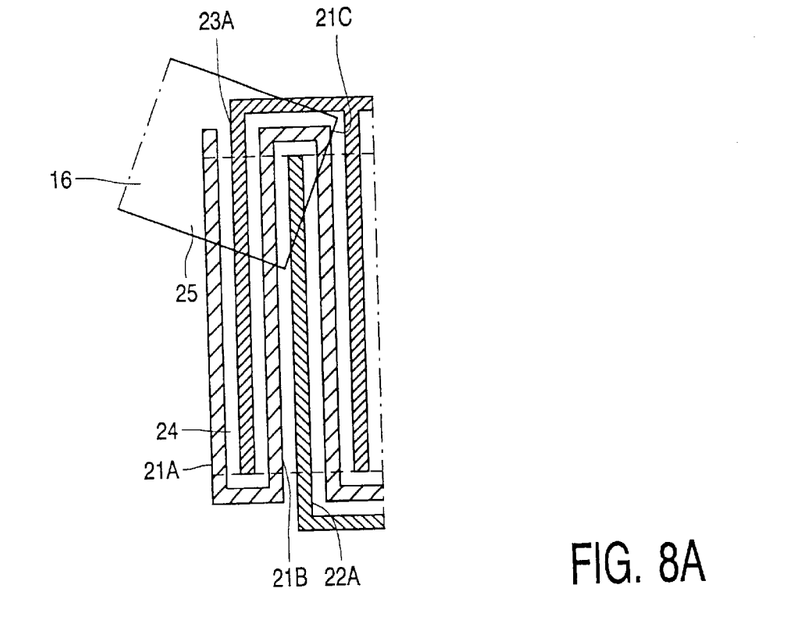
FIGS. 8A and 8B respectively show, in part, the views of FIGS. 2 and 5 each with a misalignment of the bonded region of the wire which nevertheless connects respectively the two and the five bond pad portions.

Referring now to FIG. 8A, the three part bond pad pattern of FIG. 2 is shown again in part with the bonded region 25 of the wire 16 misaligned in both directions towards a corner of the bond pad area 24 and also skewed. The bonded region 25 nevertheless covers the fingers 21A, 23A, 21B and 22A and so the three bond pad portions are connected.

Figure 8B:
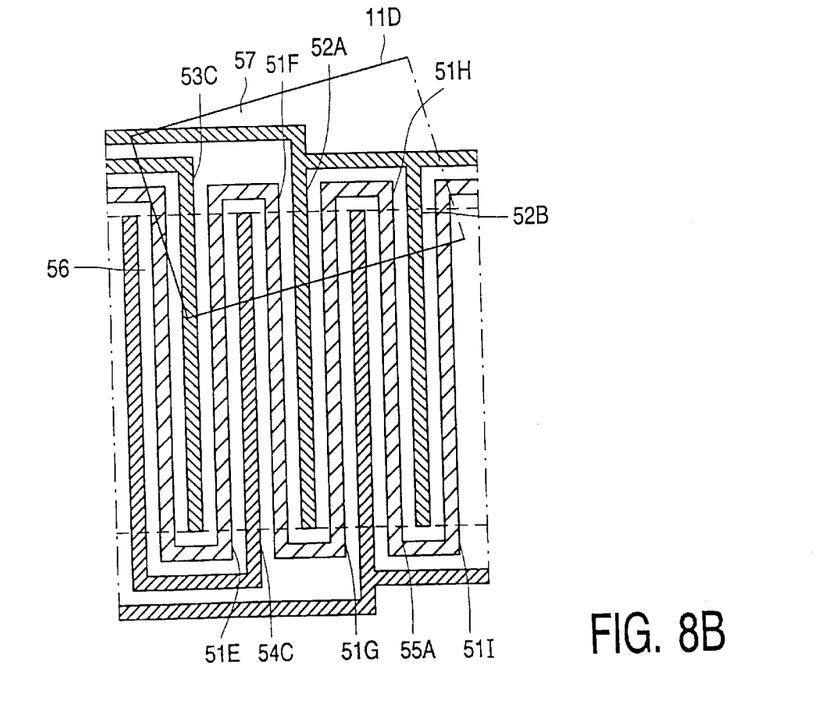

Referring now to FIG. 8B, the five part bond pad pattern of FIG. 5 is shown again in part with the bonded region 57 of the wire 11D misaligned in both directions towards a corner of the bond pad area 56 and also skewed. The bonded region 57 nevertheless connects the fingers 51E, 51F, 51G, 51H, 52A, 52B, 53C, 54C, and 55A and so the five bond pad portions are connected.

In the above description, the semiconductor device incorporating the invention has been exemplified as a semiconductor power device with one or more protection devices. The invention, having the defined combination of characterising features, that is involving interdigitated bond pad portions and a rectangular bonded region with its length extending across the fingers of the bonded pad portions, may alternatively be incorporated in an integrated circuit semiconductor device having analogue and/or digital circuits. Integrated circuits use much thinner aluminium than is used for the power devices described above, for example 1 $\mu$m or less, and the widths of the bond pad part fingers and the gaps between the fingers will be correspondingly small.

What is claimed is:

1. A semiconductor device configured to tolerate connection misalignment including: a semiconductor device body having first and second electrical circuit components formed therein; an electrical conductor layer formed on said semiconductor device body, said conductor layer including a first bond pad portion electrically connected by said layer to said first circuit component and said conductor layer including a second bond pad portion electrically connected by said layer to said second circuit component, said first and second bond pad portions being formed separated from each other, characterized in that said first bond pad portion has a first set of parallel fingers and said second bond pad portion has a respective second set of parallel fingers disposed adjacent to said first set of fingers in an interdigitated pattern, said interdigitated pattern defining a bond pad area; and terminal connection means comprising an elongated portion bonded to said device body over a substantially rectangular bonding region with the length of said bonding region extending in a direction across the fingers of said bond pad area so as to cause an equal electrical potential therebetween.

2. A semiconductor device as claimed in claim 1, wherein said first circuit component is a semiconductor power device having first and second main electrodes and a control electrode, and wherein said first bond pad portion is connected by said conductor layer to one of said electrodes of said power device.

3. A semiconductor device as claimed in claim 2, wherein said power device is a power transistor device, said first main electrode is a drain electrode, said second main electrode is a source electrode, and said control electrode is a gate electrode.

4. A semiconductor device as claimed in claim 3, wherein said second circuit component is a protection device connected between said gate electrode and one of said drain and source electrodes for protecting said power transistor device.

5. A semiconductor device as claimed in claim 4, wherein said protection device is an electrostatic discharge (ESD) protection device or a voltage clamping protection device.

6. A semiconductor device as claimed in claim 1, wherein; said semiconductor device body has a third electrical circuit component formed therein; said electrical conductor layer includes a respective third bond pad portion electrically connected by said layer to said third circuit component, said third bond pad portion being formed separated from said first and second bond pad portions, said terminal connection means is bonded to said first, second and third bond pad portions to electrically connect those three portions on said device body; said third bond pad portion has a respective third set of parallel fingers disposed adjacent to at least one of said first and second sets of fingers such that said bond pad area is defined by said interdigitated pattern formed by said first, second and third sets of fingers; and the length of said substantially rectangular bonding region extends in a direction across the first, second and third sets of fingers of said bond pad area so as to cause an equal electrical potential therebetween.

7. A semiconductor device as claimed in claim 6, wherein said first circuit component is a power transistor device having a drain electrode, a source electrode and a gate electrode, wherein said first bond pad portion is connected by said conductor layer to said gate electrode, wherein said second circuit component is an electrostatic discharge (ESD) protection device connected by said conductor layer between said second bond pad portion and one of said drain and source electrodes, and wherein said third circuit component is a voltage clamping protection device connected by said conductor layer between said third bond pad portion and the other of said drain and source electrodes.

8. A semiconductor device as claimed in claim 1, wherein at least one said set of parallel fingers has at least three said parallel fingers in that set.

9. A semiconductor device as claimed in claim 8, wherein at least one said set of parallel fingers has all the fingers of the set connected by said conductor layer outside said bond pad area at one end of the fingers of that set.

10. A semiconductor device as claimed in claim 8, wherein at least one said set of parallel fingers has successive pairs of the fingers of that set connected by said conductor layer outside said bond pad area at opposite ends of the fingers of that set to form a serpentine conductor layer path with the fingers of that set.

11. A semiconductor device as claimed in claim 1, wherein said terminal connection means is a metal wire which is wedge-bonded at one end thereof to said bond pad portions.

12. A semiconductor device as claimed in claim 11, wherein the length of said bonded region is at least three times the diameter of said metal wire.

13. A semiconductor device as claimed in claim 1, wherein said terminal connection means is a metal strap which is bonded at said one end thereof to said bond pad portions.

14. A semiconductor device as claimed in claim 1, wherein, for each said circuit component, said conductor layer provides a test pad outside said bond pad area for said independent electrical testing of that circuit component.

15. A semiconductor device as claimed in claim 1, wherein said bond pad area and said terminal connection means are geometrically configured to tolerate misalignment of said terminal connection means while nonetheless establishing an electrical connection to said first and second set of parallel fingers.

16. A semiconductor device as claimed in claim 6, wherein said bond pad area and said terminal connection means are geometrically configured to tolerate misalignment of said terminal connection means while nonetheless establishing an electrical connection to said first, second and third set of parallel fingers.

17. A semiconductor device able to tolerate connection misalignment where two or more electrically isolated semiconductor components are to be electrically connected by a terminal connector, comprising:

a lead from each semiconductor component positioned collectively to form a bond pad area;

wherein the leads are arranged so that they are electrically isolated from each other in the bond pad area but positioned adjacent to each other so as to provide a plurality of possible connection points to said terminal connector; and wherein the terminal connector is configured to connect to each lead at least at one point.

18. The semiconductor device of claim 17, wherein the leads are arranged in an interdigitated pattern and the terminal connector is of an elongated shape and positioned to connect across the interdigitated pattern.

19. The semiconductor device of claim 18, wherein said terminal connector connects across the interdigitated pattern at an angle to the direction of the leads or off-center of the leads.

* * * * *